(12) United States Patent
Ito et al.

(10) Patent No.: US 10,395,943 B2
(45) Date of Patent: Aug. 27, 2019

(54) PATTERNING METHOD, METHOD FOR PRODUCING PROCESSED SUBSTRATE, METHOD FOR PRODUCING OPTICAL COMPONENT, METHOD FOR PRODUCING CIRCUIT BOARD, AND METHOD FOR PRODUCING ELECTRONIC COMPONENT

(71) Applicant: CANON KABUSHIKI KAISHA, Tokyo (JP)

(72) Inventors: Toshiki Ito, Kawasaki (JP); Takeshi Honma, Tokyo (JP); Shiori Yonezawa, Tokyo (JP); Tomonori Otani, Iruma (JP); Kazumi Iwashita, Kobe (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/553,904

(22) PCT Filed: Feb. 15, 2016

(86) PCT No.: PCT/JP2016/000765
§ 371 (c)(1),
(2) Date: Aug. 25, 2017

(87) PCT Pub. No.: WO2016/136181
PCT Pub. Date: Sep. 1, 2016

(65) Prior Publication Data
US 2018/0047581 A1 Feb. 15, 2018

(30) Foreign Application Priority Data
Feb. 27, 2015 (JP) .................................. 2015-039402

(51) Int. Cl.
*H01L 21/311* (2006.01)
*G03F 7/00* (2006.01)
(Continued)

(52) U.S. Cl.
CPC ...... *H01L 21/31144* (2013.01); *G03F 7/0002* (2013.01); *G03F 7/027* (2013.01);
(Continued)

(58) Field of Classification Search
CPC ........... H01L 21/31144; H01L 21/0337; H01L 21/31116; H01L 21/0273; G03F 7/0002; G03F 7/027
(Continued)

(56) References Cited

U.S. PATENT DOCUMENTS

2004/0211754 A1* 10/2004 Sreenivasan .......... B81C 1/0046
 216/41
2007/0160937 A1 7/2007 Ogino
(Continued)

FOREIGN PATENT DOCUMENTS

JP 05-188355 A 7/1993
JP 2006-524919 A 11/2006
(Continued)

OTHER PUBLICATIONS

H. Gokan, S. Esho, et al., "Dry Etch Resistance of Organic Materials", Nippon Electric Company, Limited, Basic Technology Research Laboratories, Takatsuku Kawasaki 213 Japan; J. Elctrochem Soc; 1983, vol. 130, pp. 143-146.
(Continued)

*Primary Examiner* — Binh X Tran
(74) *Attorney, Agent, or Firm* — Canon U.S.A. Inc., IP Division (57) ABSTRACT

To provide a patterning method for forming a desired pattern in a reverse process.

A patterning method includes a reverse process.

A photocurable composition contains at least a polymerizable compound (A) component and a photopolymerization initiator (B) component.

The (A) component has a mole fraction weighted average molecular weight of 200 or more and 1000 or less.

The (A) component has an Ohnishi parameter (OP) of 3.80 or more.

The Ohnishi parameter (OP) of the (A) component is a mole fraction weighted average of $N/(N_C-N_O)$, wherein N denotes a total number of atoms in a molecule, $N_C$ denotes a number of carbon atoms in the molecule, and $N_O$ denotes a number of oxygen atoms in the molecule.

18 Claims, 3 Drawing Sheets

STEP [6]

(51) Int. Cl.
*H01L 21/027* (2006.01)
*H01L 21/033* (2006.01)
*G03F 7/027* (2006.01)

(52) U.S. Cl.
CPC ...... *H01L 21/0273* (2013.01); *H01L 21/0337* (2013.01); *H01L 21/31116* (2013.01)

(58) Field of Classification Search
USPC .............................. 438/717, 725; 216/44, 54
See application file for complete search history.

(56) References Cited

U.S. PATENT DOCUMENTS

| | | | | |
|---|---|---|---|---|
| 2012/0199997 A1* | 8/2012 | Tanabe | ................... | B82Y 10/00 264/82 |
| 2014/0034125 A1* | 2/2014 | Pernel | ............. | H01L 31/022425 136/256 |
| 2014/0220353 A1* | 8/2014 | Kodama | ................. | G03F 7/094 428/411.1 |
| 2015/0028524 A1 | 1/2015 | Kobayashi | | |

FOREIGN PATENT DOCUMENTS

| | | |
|---|---|---|
| JP | 2007-186570 A | 7/2007 |
| JP | 2011-153187 A | 8/2011 |
| JP | 2012-164785 A | 8/2012 |
| JP | 2013-093552 A | 5/2013 |
| JP | 2013-130751 A | 7/2013 |
| JP | 2013-143527 A | 7/2013 |
| JP | 2013-232452 A | 11/2013 |
| JP | 2015-026740 A | 2/2015 |
| KR | 20060004679 A | 1/2006 |
| KR | 20140072192 A | 6/2014 |
| WO | 2004/097518 A2 | 11/2004 |
| WO | 2011/132616 A1 | 10/2011 |
| WO | 2013/051735 A1 | 4/2013 |
| WO | 2013/162049 A1 | 10/2013 |
| WO | 2014/208571 A1 | 12/2014 |

OTHER PUBLICATIONS

Ethylene Glycol Dimethacrylate, Tokyo Chemical Industry Co., Ltd., Products, retrieved from https://www.tcichemicals.com/eshop/en/jp/commodity/E0102/.

Light Ester, Functional monomers & oligomers, Kyoeisha Chemical Co., Ltd., retrieved from https://www.kyoeisha.co.p/en/kinou/lightester.php.

Benzyl Methacrylate, Tokyo Chemical Industry Co., Ltd., Products, retrieved from https://www.tcichemicals.com/eshop/en/jp/commodity/M0279/.

* cited by examiner

[Fig. 1A]

STEP [1]

[Fig. 1B]

STEP [2]

[Fig. 1C]

STEP [3]

[Fig. 1D]

STEP [4]

[Fig. 2A]

STEP [5]

[Fig. 2B]

STEP [6]

[Fig. 2C]

STEP [7]

[Fig. 3]

PATTERNING METHOD, METHOD FOR PRODUCING PROCESSED SUBSTRATE, METHOD FOR PRODUCING OPTICAL COMPONENT, METHOD FOR PRODUCING CIRCUIT BOARD, AND METHOD FOR PRODUCING ELECTRONIC COMPONENT

TECHNICAL FIELD

The present invention relates to a patterning method, a method for producing a processed substrate, a method for producing an optical component, a method for producing a circuit board, and a method for producing an electronic component.

BACKGROUND ART

There is a growing demand for fine semiconductor devices and microelectromechanical systems (MEMS). Thus, a photo-nanoimprint technique is attracting attention as micro- and nano-fabrication technology.

In the photo-nanoimprint technique, a photocurable composition (resist) on a substrate (wafer) is cured while a mold having a fine uneven pattern on its surface is pressed against the substrate. The uneven pattern of the mold is transferred to a cured film of the photocurable composition on the substrate. The photo-nanoimprint technique can form a fine structure on the order of nanometers on substrates.

In a photo-nanoimprint technique described in PTL 1, a resist is first placed in a patterning region on a substrate (placement step). The resist is then patterned with a patterned mold (mold contact step). The resist is then cured by photoirradiation (photoirradiation step) and is removed (demolding step). Through these steps, a resist pattern (photocured film) having a predetermined shape is formed on the substrate (FIGS. 1A to 1D).

A substrate may be processed in a reverse process using a pattern formed by the photo-nanoimprint technique as a mask.

PTL 2 discloses the following steps. A reverse layer is formed on an uneven pattern (reverse layer forming step). While the recessed portions are filled with the reverse layer material, part of the reverse layer is removed to expose the top faces of the raised portions of the uneven pattern (reverse layer partial removal step). The reverse layer in the recessed portions is used as a mask. The layer having the uneven pattern and an underlying layer to be processed are etched through the mask to form a reverse pattern formed of the reverse layer material (etching step).

CITATION LIST

Patent Literature

PTL 1: Japanese Patent Laid-Open No. 2007-186570
PTL 2: PCT Japanese Translation Patent Publication No. 2006-524919

Non-Patent Literature

NPL 1: J. Electrochem. Soc., 130, p. 143 (1983)

SUMMARY OF INVENTION

Technical Problem

In the photo-nanoimprint technique described in PTL 1, the uneven pattern of the cured film itself serves as an etching mask and should therefore be formed of a resist having high dry etch resistance.

In contrast, in the reverse process as described in PTL 2, the reverse layer is used as an etching mask, and the layer having the uneven pattern must be rapidly removed. In other words, the layer having the uneven pattern must have a much higher dry etching rate for the etching gas than the reverse layer.

Furthermore, in order to form a precise uneven pattern with high productivity by the photo-nanoimprint technique, it is necessary to decrease the demolding force, that is, the force with which the mask is removed from the photocured film of the resist in the demolding step. This is because a high demolding force results in an increased number of defects (demolding defects), which is caused by part of the resist pattern being torn off by demolding and remaining on the mask. Thus, the demolding force should be lowered.

More specifically, it is very difficult to repeatedly form an uneven pattern of a photocured film without defects using a mold having a high uneven pattern (for example, 40 nm or more).

When a photocured film formed by the photo-nanoimprint technique is applied to a layer having an uneven pattern in a reverse process including the use of a reverse layer, the characteristics required for the photocured film is different from the characteristics required for typical imprint resists. Thus, there is a demand for a new formation method using an imprint resist suitable for such an application.

The present invention provides a patterning method for forming a desired pattern in a reverse process.

Solution to Problem

A patterning method according to the present invention includes
placing a photocurable composition on a substrate (placement step),
bringing the photocurable composition into contact with a mold having an uneven pattern (mold contact step),
irradiating the photocurable composition with light to form a cured film (photoirradiation step),
separating the cured film from the mold (demolding step),
forming a reverse layer on the cured film to which the uneven pattern of the mold has been transferred (reverse layer forming step).
while recessed portions of the uneven pattern of the cured film are filled with the reverse layer, removing part of the reverse layer to expose raised portions of the uneven pattern (reverse layer partial removal step), and
etching the photocurable composition layer to form a reverse pattern using the reverse layer in the recessed portions as a mask (etching step),
wherein the photocurable composition contains at least a polymerizable compound (A) component and a photopolymerization initiator (B) component,
the (A) component has a mole fraction weighted average molecular weight of 200 or more and 1000 or less,
and the (A) component has an Ohnishi parameter (OP) of 3.80 or more.

The Ohnishi parameter (OP) of the (A) component is a mole fraction weighted average of $N/(N_C-N_O)$, N denotes a total number of atoms in a molecule, $N_C$ denotes a number of carbon atoms in the molecule, and $N_O$ denotes a number of oxygen atoms in the molecule.

Further features of the present invention will become apparent from the following description of exemplary embodiments with reference to the attached drawings.

DESCRIPTION OF EMBODIMENTS

Embodiments of the present invention will be described in detail below with reference to the accompanying drawings. The present invention is not limited to these embodiments. Variations and modifications may be made to these embodiments on the basis of the common knowledge of a person skilled in the art without departing from the gist of the present invention. Such variations and modifications also fall within the scope of the present invention.
Photocurable Compositions A photocurable composition according to the present embodiment contains a polymerizable compound component (A) and a photopolymerization initiator component (B). A photocurable composition according to the present embodiment may contain a non-polymerizable compound component (C).

The term "cured film", as used herein, refers to a film formed by polymerization and curing of a photocurable composition on a substrate. The cured film may have any shape and may have a pattern on its surface.

The components will be described in detail below.
<Component (A): Polymerizable Compound>

The component (A) is a polymerizable compound. The term "polymerizable compound", as used herein, refers to a compound that reacts with a polymerizing factor (such as a radical) generated from a photopolymerization initiator (component (B)) and forms a polymer compound film through a chain reaction (polymerization reaction).

For example, the polymerizable compound may be a radical polymerizable compound. The polymerizable compound component (A) may be composed of a polymerizable compound or two or more polymerizable compounds.

The radical polymerizable compound can be a compound having at least one acryloyl or methacryloyl group, that is, a (meth)acrylic compound. Thus, a photocurable composition according to the present embodiment can contain a (meth)acrylic compound as the component (A). The component (A) can be composed mainly of a (meth)acrylic compound. A photocurable composition according to the present embodiment can be a (meth)acrylic compound. The sentence "the component (A) is composed mainly of a (meth)acrylic compound", as used herein, means that 90% by weight or more of the component (A) is the (meth)acrylic compound.

When the radical polymerizable compound is composed of two or more compounds having at least one acryloyl or methacryloyl group, the radical polymerizable compound can contain a monofunctional (meth)acrylic monomer and a polyfunctional (meth)acrylic monomer. This is because a combination of a monofunctional (meth)acrylic monomer and a polyfunctional (meth)acrylic monomer can form a cured film having high mechanical strength.

Examples of monofunctional (meth)acrylic compounds having one acryloyl or methacryloyl group include, but are not limited to, phenoxyethyl (meth)acrylate, phenoxy-2-methylethyl (meth)acrylate, phenoxyethoxyethyl (meth)acrylate, 3-phenoxy-2-hydroxypropyl (meth)acrylate, 2-phenylphenoxyethyl (meth)acrylate, 4-phenylphenoxyethyl (meth)acrylate, 3-(2-phenylphenyl)-2-hydroxypropyl (meth)acrylate, EO-modified p-cumylphenol (meth)acrylate, 2-bromophenoxyethyl (meth)acrylate, 2,4-dibromophenoxyethyl (meth)acrylate, 2,4,6-tribromophenoxyethyl (meth)acrylate, EO-modified phenoxy(meth)acrylate, PO-modified phenoxy(meth)acrylate, polyoxyethylene nonylphenyl ether (meth)acrylate, isobornyl (meth)acrylate, 1-adamantyl (meth)acrylate, 2-methyl-2-adamantyl (meth)acrylate, 2-ethyl-2-adamantyl (meth)acrylate, bornyl (meth)acrylate, tricyclodecanyl (meth)acrylate, dicyclopentanyl (meth)acrylate, dicyclopentenyl (meth)acrylate, cyclohexyl (meth)acrylate, 4-butylcyclohexyl (meth)acrylate, acryloylmorpholine, 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth)acrylate, isopropyl (meth)acrylate, butyl (meth)acrylate, amyl (meth)acrylate, isobutyl (meth)acrylate, t-butyl (meth)acrylate, pentyl (meth)acrylate, isoamyl (meth)acrylate, hexyl (meth)acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, isostearyl (meth)acrylate, benzyl (meth)acrylate, tetrahydrofurfuryl (meth)acrylate, butoxyethyl (meth)acrylate, ethoxydiethylene glycol (meth)acrylate, poly(ethylene glycol) mono(meth)acrylate, poly(propylene glycol) mono(meth)acrylate, methoxyethylene glycol (meth)acrylate, ethoxyethyl (meth)acrylate, methoxy poly(ethylene glycol) (meth)acrylate, methoxy poly(propylene glycol) (meth)acrylate, diacetone (meth)acrylamide, isobutoxymethyl (meth)acrylamide, N,N-dimethyl (meth)acrylamide, t-octyl (meth)acrylamide, dimethylaminoethyl (meth)acrylate, diethylaminoethyl (meth)acrylate, 7-amino-3,7-dimethyloctyl (meth)acrylate, N,N-diethyl (meth)acrylamide, and N,N-dimethylaminopropyl (meth)acrylamide.

Examples of commercial products of monofunctional (meth)acrylic compounds include, but are not limited to, Aronix (registered trademark) M101, M102, M110, M111, M113, M117, M5700, TO-1317, M120, M150, and M156 (manufactured by Toagosei Co., Ltd.), MEDOL-10, MIBDOL-10, CHDOL-10, MMDOL-30, MEDOL30, MIBDOL-30, CHDOL-30, LA, IBXA, 2-MTA, HPA, and Viscoat #150, #155, #158, #190, #192, #193, #220, #2000, #2100, and #2150 (manufactured by Osaka Organic Chemical Industry Ltd.), Light Acrylate BO-A, EC-A, DMP-A, THF-A, HOPA, HOA-MPE, HOA-MPL, PO-A, P-200A, NP-4EA, and NP-8EA, and Epoxy Ester M-600A (manufactured by Kyoeisha Chemical Co., Ltd.), Kayarad (registered trademark) TC110S, R-564, and R-128H (manufactured by Nippon Kayaku Co., Ltd.), NK ester AMP-10G and AMP-20G (manufactured by Shin Nakamura Chemical Co., Ltd.), FA-511A, 512A, and 513A (manufactured by Hitachi Chemical Co., Ltd.), PHE, CEA, PHE-2, PHE-4, BR-31, BR-31M, and BR-32 (manufactured by Dai-ichi Kogyo Seiyaku Co., Ltd.), VP (manufactured by BASF), and ACMO, DMAA, and DMAPAA (manufactured by Kohjin Co., Ltd.).

Examples of a polyfunctional (meth)acrylic compound having two or more acryloyl or methacryloyl groups include, but are not limited to, trimethylolpropane di(meth)acrylate, trimethylolpropane tri(meth)acrylate, EO-modified trimethylolpropane tri(meth)acrylate, PO-modified trimethylolpropane tri(meth)acrylate, EO,PO-modified trimethylolpropane tri(meth)acrylate, dimethyloltricyclodecane di(meth)acrylate, pentaerythritol tri(meth)acrylate, pentaerythritol tetra(meth)acrylate, ethylene glycol di(meth)acrylate, tetraethylene glycol di(meth)acrylate, poly(ethylene glycol) di(meth)acrylate, poly(propylene glycol) di(meth)acrylate, 1,4-butanediol di(meth)acrylate, 1,6-hexanediol di(meth)acrylate, neopentyl glycol di(meth)acrylate, 1,9-nonanediol di(meth)acrylate, 1,10-decanediol di(meth)acrylate, 1,3-adamantane dimethanol di(meth)acrylate, tris(2-hydroxyethyl)isocyanurate tri(meth)acrylate, tris(acryloyloxy) isocyanurate, bis(hydroxymethyl)tricyclodecane di(meth)acrylate, dipentaerythritol penta(meth)acrylate, dipentaerythritol hexa(meth)acrylate, EO-modified 2,2-bis(4-((meth)acryloxy)phenyl)propane, PO-modified 2,2-bis(4-((meth)acryloxy)phenyl)propane, and EO,PO-modified 2,2-bis(4-((meth)acryloxy)phenyl)propane.

Examples of commercial products of a polyfunctional (meth)acrylic compound include, but are not limited to, Yupimer (registered trademark) UV SA1002 and SA2007 (manufactured by Mitsubishi Chemical Corp.), Viscoat #195, #230, #215, #260, #335HP, #295, #300, #360, #700, GPT, and 3PA (manufactured by Osaka Organic Chemical Industry Ltd.), Light Acrylate 4EG-A, 9EG-A, NP-A, DCP-A, BP4EA, BP-4PA, TMP-A, PE-3A, PE-4A, and DPE-6A (manufactured by Kyoeisha Chemical Co., Ltd.), Kayarad (registered trademark) PET-30, TMPTA, R-604, DPHA, DPCA-20, -30, -60, and -120, HX-620, D-310, and D-330 (manufactured by Nippon Kayaku Co., Ltd.), Aronix (registered trademark) M208, M210, M215, M220, M240, M305, M309, M310, M315, M325, and M400 (manufactured by Toagosei Co., Ltd.), and Ripoxy (registered trademark) VR-77, VR-60, and VR-90 (manufactured by Showa Denko K.K.).

The term "(meth)acrylate" in these compounds refers to an acrylate or a methacrylate having the same alcohol residue as its corresponding acrylate. The term "(meth)acryloyl group" refers to an acryloyl group or a methacryloyl group having the same alcohol residue as its corresponding acryloyl group. EO refers to ethylene oxide. An EO-modified compound A refers to a compound in which a (meth)acrylic acid residue and an alcohol residue of the compound A are bound together through an ethylene oxide group block structure. PO refers to propylene oxide. A PO-modified compound B refers to a compound in which a (meth)acrylic acid residue and an alcohol residue of the compound B are bound together through a propylene oxide group block structure.

<Ohnishi Parameter (OP) of (A) Component>

It is known that the dry etching rate V of a composition, the total number N of atoms in the composition, the total number $N_C$ of carbon atoms in the composition, and the total number $N_O$ of oxygen atoms in the composition have the relationship represented by the following formula (1) (NPL 1).

$$V \propto N/(N_C - N_O) \quad (1)$$

$N/(N_C - N_O)$ is commonly referred to as the "Ohnishi parameter" (hereinafter referred to as OP). For example, PTL 1 describes a technique for producing a photocurable composition having high dry etch resistance from a polymerizable compound component having a small Ohnishi parameter.

The formula (1) indicates that an organic compound having a greater number of oxygen atoms in its molecule or an organic compound having a smaller number of aromatic ring structures or alicyclic structures has a greater Ohnishi parameter and a higher dry etching rate.

In a photocurable composition for use in the present invention, the (A) component has an OP of 3.80 or more. If the (A) component is composed of two or more polymerizable compounds $A_1, A_2, \ldots$, and $A_n$, the OP is calculated as a weighted average based on mole fraction (mole fraction weighted average), using the following formula (2).

$$OP = \sum_m n_i OP_i = n_1 OP_1 + n_2 OP_2 + \ldots + n_n OP_n \quad (2)$$

In the formula (2), $OP_n$ denotes the OP of the component $A_n$, and $n_n$ denotes the mole fraction of the component $A_n$ in the (A) component.

In a photocurable composition for use in the present invention, the (A) component has an OP of 3.80 or more, preferably 4.50 or more, and preferably 7.00 or less.

The composition of the component (A) in a photocurable composition according to the present embodiment can be analyzed by the infrared spectroscopy, ultravioletvisible spectroscopy, or pyrolysis gas chromatography-mass spectrometry of the photocurable composition or a cured film of the photocurable composition. Consequently, the OP of the component (A) in the photocurable composition can be determined.

In a photocurable composition according to the present embodiment, the (A) component has a mole fraction weighted average molecular weight of 200 or more and 1000 or less. If the (A) component has a mole fraction weighted average molecular weight of less than 200, the (A) component may volatilize in a placement step (A) described later, and the composition may be changed. Volatilization of the (A) component may also result in a photocured film having a smaller thickness than the desired thickness. If the (A) component has a mole fraction weighted average molecular weight of more than 1000, this may result in high viscosity and a long filling time in a mold contact step described later.

In a photocurable composition according to the present embodiment, the (A) component preferably has an OP of 7.0 or less.

<Component (B): Photopolymerization Initiator>

The component (B) is a photopolymerization initiator.

In the present embodiment, a photopolymerization initiator is a compound that senses light having a predetermined wavelength and generates a polymerizing factor (radical). More specifically, a photopolymerization initiator is a polymerization initiator (radical generator) that can generate a radical when induced by light (for example, infrared light, visible light, ultraviolet light, far-ultraviolet light, X-rays, charged particle beams, such as an electron beam, or radiation).

The component (B) may be composed of a photopolymerization initiator or two or more photopolymerization initiators.

Examples of the radical generator include, but are not limited to, optionally substituted 2,4,5-triarylimidazole dimers, such as a 2-(o-chlorophenyl)-4,5-diphenylimidazole dimer, a 2-(o-chlorophenyl)-4,5-di(methoxyphenyl)imidazole dimer, a 2-(o-fluorophenyl)-4,5-diphenylimidazole dimer, and a 2-(-o- or p-methoxyphenyl)-4,5-diphenylimidazole dimer, benzophenone derivatives, such as benzophenone, N,N'-tetramethyl-4,4'-diaminobenzophenone (Michler's ketone), N,N'-tetraethyl-4,4'-diaminobenzophenone, 4-methoxy-4'-dimethylaminobenzophenone, 4-chlorobenzophenone, 4,4'-dimethoxybenzophenone, and 4,4'-diaminobenzophenone; α-amino aromatic ketone derivatives, such as 2-benzyl-2-dimethylamino-1-(4-morpholinophenyl)-butanone-1,2-methyl-1-[4-(methyl thio)phenyl]-2-morpholino-propan-1-one; quinones, such as 2-ethylanthraquinone, phenanthrenequinone, 2-t-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, and 2,3-dimethylanthraquinone; benzoin ether derivatives, such as benzoin methyl ether, benzoin ethyl ether, and benzoin phenyl ether, benzoin derivatives, such as benzoin, methylbenzoin, ethylbenzoin, and propylbenzoin; benzyl derivatives, such as benzyl dimethyl ketal; acridine derivatives, such as 9-phenylacridine and 1,7-bis(9,9'-acridinyl)heptane; N-phenylglycine derivatives, such as N-phenylglycine; acetophenone derivatives, such as acetophenone, 3-methylacetophenone, acetophenone benzyl ketal, 1-hydroxycyclohexyl phenyl ketone, and 2,2-dimethoxy-2-phenylacetophenone; thioxanthone derivatives, such as thioxanthone, diethylthioxanthone, 2-isopropylthioxanthone, and 2-chlorothioxanthone; acylphosphine oxide derivatives, such as 2,4,6-trimethylbenzoyidiphenylphosphine oxide, bis(2,4,6-trimethylbenzoyl)phenylphosphine oxide, and bis(2,6-dimethoxybenzoyl)-2,4,4-trimethylpentylphosphine oxide; oxime ester derivatives, such as 1,2-octanedione 1-[4-(phenylthio)-,2-(O-benzoyloxime)] and ethanone, 1-[9-ethyl-6-(2-methylbenzoyl)-9H-carbazol-3-yl]-,1-(O-acetyloxime); xanthone, fluorenone, benzaldehyde, fluorene, anthraquinone, triphenylamine, carbazole, 1-(4-isopropylphenyl)-2-hydroxy-2-methylpropan-1-one, and 2-hydroxy-2-methyl-1-phenylpropan-1-one.

Examples of commercial products of the radical generator include, but are not limited to, Irgacure 184, 369, 651, 500, 819, 907, 784, 2959, CGI-1700, -1750, and -1850, CG24-61, Darocur 1116 and 1173, Lucirin (registered trademark) TPO, LR8893, and LR8970 (manufactured by BASF), and Uvecryl P36 (manufactured by Sigma-Aldrich GmbH).

Among these, the component (B) may be an acylphosphine oxide polymerization initiator. Among the examples, acylphosphine oxide polymerization initiators are acylphosphine oxide compounds, such as 2,4,6-trimethylbenzoyldiphenylphosphine oxide, bis(2,4,6-trimethylbenzoyl)phenylphosphine oxide, and bis(2,6-dimethoxybenzoyl)-2,4,4-trimethylpentylphosphine oxide.

The percentage of the photopolymerization initiator component (B) in a photocurable composition according to the present embodiment may be 0.1% by weight or more and 50% by weight or less, preferably 0.1% by weight or more and 20% by weight or less, more preferably more than 10% by weight and 20% by weight or less, of the total weight of the component (A), the component (B), and the component (C) described later, that is, the total weight of all the components other than the solvent(s).

When the percentage of the component (B) is 0.1% by weight or more of the total weight of the component (A), the component (B), and the component (C), a photocurable composition according to the present embodiment can have a high curing rate and high reaction efficiency. When the percentage of the component (B) is 50% by weight or less of the total weight of the component (A), the component (B), and the component (C), the resulting cured film can have acceptable mechanical strength.

<Component (C): Non-Polymerizable Compound>

In addition to the component (A) and the component (B), a photocurable composition according to the present embodiment may contain a non-polymerizable compound as a component (C) depending on the purpose without losing the advantages of the present invention. The component (C) may be a compound that has no polymerizable functional group, such as a (meth)acryloyl group, and that cannot sense light having a predetermined wavelength nor generate a polymerizing factor (radical). For example, the component (C) may be a sensitizer, a hydrogen donor, an internal release agent, a surfactant, an antioxidant, a polymer component, or another additive agent. The component (C) may be a mixture of two of more of these compounds.

A sensitizer is a compound appropriately added to promote a polymerization reaction and improve the reaction conversion. A sensitizer may be a sensitizing dye.

A sensitizing dye is a compound that is excited by absorbing light having a particular wavelength and interacts with the photopolymerization initiator component (B). The interaction may be energy transfer or electron transfer from an excited sensitizing dye to the photopolymerization initiator component (B).

Specific examples of the sensitizing dye include, but are not limited to, anthracene derivatives, anthraquinone derivatives, pyrene derivatives, perylene derivatives, carbazole derivatives, benzophenone derivatives, thioxanthone derivatives, xanthone derivatives, coumarin derivatives, phenothiazine derivatives, camphorquinone derivatives, acridine dyes, thiopyrylium salt dyes, merocyanine dyes, quinoline dyes, styrylquinoline dyes, ketocoumarin dyes, thioxanthene dyes, xanthene dyes, oxonol dyes, cyanine dyes, rhodamine dyes, and pyrylium salt dyes.

These sensitizers may be used alone or in combination of two or more thereof.

A hydrogen donor is a compound that reacts with an initiator radical generated from the photopolymerization initiator component (B) or a radical at a propagating end to form a more reactive radical. A hydrogen donor can be added when the photopolymerization initiator component (B) is a photo radical generator.

Specific examples of the hydrogen donor include, but are not limited to, amine compounds, such as n-butylamine, di-n-butylamine, tri-n-butylphosphine, allylthiourea, s-benzylisothiuronium-p-toluene sulfinate, triethylamine, diethylaminoethyl methacrylate, triethylenetetramine, 4,4'-bis(dialkylamino)benzophenones, ethyl N,N-dimethylaminobenzoate, isoamyl N,N-dimethylaminobenzoate, pentyl-4-dimethylaminobenzoate, triethanolamine, and N-phenylglycine; and mercapto compounds, such as 2-mercapto-N-phenylbenzimidazole and mercaptopropionic acid esters.

These hydrogen donors may be used alone or in combination of two or more thereof. The hydrogen donor may have a function of a sensitizer.

An internal release agent can be added to a photocurable composition according to the present embodiment in order to decrease the interfacial bond strength between a mold and a resist, that is, the demolding force in the demolding step described later. The term "internal", as used herein in the context of an additive, means that the additive is added in advance to a photocurable composition before the placement step.

The internal release agent may be a surfactant, such as a silicone surfactant, a fluorosurfactant, or a hydrocarbon surfactant. The internal release agent has no polymerization reactivity.

Examples of the fluorosurfactant include, but are not limited to, poly(alkylene oxide) (such as poly(ethylene oxide) or poly(propylene oxide)) adducts of alcohols having a perfluoroalkyl group and poly(alkylene oxide) (such as poly(ethylene oxide) or poly(propylene oxide)) adducts of perfluoropolyethers. The fluorosurfactant may have a hydroxy group, an alkoxy group, an alkyl group, an amino group, and/or a thiol group as part of its molecular structure (for example, as an end group).

The fluorosurfactant may be a commercial product. Examples of the commercial product include, but are not limited to, Megaface (registered trademark) F-444, TF2066, TF-2067, and TF-2068 (manufactured by DIC Corporation), Fluorad FC-430 and FC-431 (manufactured by Sumitomo 3M Ltd.), Surflon (registered trademark) S-382 (manufactured by AGC Seimi Chemical Co., Ltd.), EFTOP EF-122A, 122B, 122C, EF-121, EF-126, EF-127, and MF-100 (manufactured by Tohkem Products Corporation), PF-636, PF-6320, PF-656, and PF-6520 (manufactured by OMNOVA Solutions Inc.), Unidyne (registered trademark) DS-401, DS-403, and DS-451 (manufactured by Daikin Industries, Ltd.), and Ftergent (registered trademark) 250, 251, 222F, and 208G (manufactured by NEOS Co., Ltd.).

The internal release agent may be a hydrocarbon surfactant.

The hydrocarbon surfactant may be an alkyl alcohol poly(alkylene oxide) adduct in which an alkylene oxide having 2 to 4 carbon atoms is added to an alkyl alcohol having 1 to 50 carbon atoms.

Examples of the alkyl alcohol poly(alkylene oxide) adduct include, but are not limited to, methyl alcohol ethylene oxide adducts, decyl alcohol ethylene oxide adducts, lauryl alcohol ethylene oxide adducts, cetyl alcohol ethylene oxide adducts, stearyl alcohol ethylene oxide adducts, and stearyl alcohol ethylene oxide/propylene oxide adducts. An end group of the alkyl alcohol poly(alkylene oxide) adduct is not limited to a hydroxy group resulting from simple addition of poly(alkylene oxide) to an alkyl alcohol. This hydroxy group may be substituted by another substituent, for example, a polar functional group, such as a carboxy group, an amino group, a pyridyl group, a thiol group, or a silanol group, or a hydrophobic functional group, such as an alkyl group or an alkoxy group.

The alkyl alcohol poly(alkylene oxide) adduct may be a commercial product. Examples of the commercial product include, but are not limited to, polyoxyethylene methyl ethers (methyl alcohol ethylene oxide adducts) manufactured by Aoki Oil Industrial Co., Ltd. (BLAUNON MP-400, MP-550, and MP-1000), polyoxyethylene decyl ethers (decyl alcohol ethylene oxide adducts) manufactured by Aoki Oil Industrial Co., Ltd. (FINESURF D-1303, D-1305, D-1307, and D-1310), a polyoxyethylene lauryl ether (lauryl alcohol ethylene oxide adducts) manufactured by Aoki Oil Industrial Co., Ltd. (BLAUNON EL-1505), polyoxyethylene cetyl ethers (cetyl alcohol ethylene oxide adducts) manufactured by Aoki Oil Industrial Co., Ltd. (BLAUNON CH-305 and CH-310), polyoxyethylene stearyl ethers (stearyl alcohol ethylene oxide adducts) manufactured by Aoki Oil Industrial Co., Ltd. (BLAUNON SR-705, SR-707, SR-715, SR-720, SR-730, and SR-750), random polymerization type polyoxyethylene polyoxypropylene stearyl ethers manufactured by Aoki Oil Industrial Co., Ltd. (BLAUNON SA-50/50 1000R and SA-30/70 2000R), a polyoxyethylene methyl ether manufactured by BASF (Pluriol (registered trademark) A760E), and polyoxyethylene alkyl ethers manufactured by Kao Corporation (Emulgen series).

Among these hydrocarbon surfactants, the internal release agent may be an alkyl alcohol poly(alkylene oxide) adduct or a long-chain alkyl alcohol poly(alkylene oxide) adduct.

The internal release agents may be used alone or in combination of two or more thereof.

The percentage of the non-polymerizable compound component (C) in a photocurable composition according to the present embodiment may be 0% by weight or more and 50% by weight or less, preferably 0.1% by weight or more and 50% by weight or less, more preferably 0.1% by weight or more and 20% by weight or less, of the total weight of the component (A), the component (B), and the component (C) described later, that is, the total weight of all the components other than the solvent(s).

When the percentage of the component (C) is 50% by weight or less of the total weight of the component (A), the component (B), and the component (C), the resulting cured film can have acceptable mechanical strength.

<Component (D): Solvent>

A photocurable composition according to the present embodiment may contain a solvent as a component (D). The component (D) may be any solvent that can dissolve the component (A), the component (B), and the component (C). The solvent preferably has a boiling point of 80° C. or more and 200° C. or less at normal pressure. The solvent can have at least one of an ester structure, a ketone structure, a hydroxy group, and an ether structure. More specifically, the solvent may be propylene glycol monomethyl ether acetate, propylene glycol monomethyl ether, cyclohexanone, 2-heptanone, γ-butyrolactone, and/or ethyl lactate, used alone or as a mixed solvent thereof.

<Temperature of Photocurable Composition in Blending>

In the preparation of a photocurable composition according to the present embodiment, at least the component (A) and the component (B) are mixed and dissolved under predetermined temperature conditions, more specifically, at 0° C. or more and 100° C. or less. This is also applied to a photocurable composition containing the additive component (C).

<Viscosity of Photocurable Composition>

A mixture of the components other than the solvent(s) (the component (D)) of a photocurable composition according to the present embodiment preferably has a viscosity of 1 mPa s or more and 100 mPa s or less, more preferably 1 mPa s or more and 50 mPa s or less, still more preferably 1 mPa s or more and 12 mPa s or less, at 25° C.

A photocurable composition having a viscosity of 100 mPa s or less can fill a recessed portion of a micro- and/or nano-pattern on a mold in a short time when the mold pattern comes into contact with the photocurable composition. Thus, a photo-nanoimprint method can be performed with high productivity using a photocurable composition according to the present embodiment. The cured film is less prone to a pattern defect due to incomplete filling.

A photocurable composition having a viscosity of 1 mPa s or more can be more uniformly applied to a substrate. Furthermore, when a photocurable composition having a viscosity of 1 mPa s or more comes into contact with a mold, a less amount of photocurable composition flows out of the mold edge.

<Surface Tension of Photocurable Composition>

A mixture of the components other than the solvent(s) (the component (D)) of a photocurable composition according to the present embodiment preferably has a surface tension of 5 mN/m or more and 70 mN/m or less, more preferably 7 mN/m or more and 35 mN/m or less, still more preferably 10 mN/m or more and 32 mN/m or less, at 23° C. A photocurable composition having a surface tension of 5 mN/m or more can fill a recessed portion of a micro- and/or nano-pattern on a mold in a short time when the mold pattern comes into contact with the photocurable composition.

A cured film of a photocurable composition having a surface tension of 70 mN/m or less has a smooth surface.

<Impurities in Photocurable Composition>

A photocurable composition according to the present embodiment contains as few impurities as possible. The impurities refer to components other than the component (A), the component (B), the component (C), and the component (D).

Thus, a photocurable composition according to the present embodiment can be a photocurable composition subjected to a purification step. The purification step can be filtration through a filter.

More specifically, for filtration through a filter, a mixture of the component (A), the component (B), and an optional additive component can be passed through a filter, for example, having a pore size of 0.001 μm or more and 5.0 μm or less. For filtration through a filter, the filtration can be performed in multiple stages or multiple times. A filtered liquid may be filtered again. A plurality of filters having different pore sizes may be used. A filter for filtration may be, but is not limited to, a polyethylene filter, a polypropylene filter, a fluoropolymer filter, or a nylon filter.

Impurities, such as particles, in a photocurable composition according to the present embodiment can be removed in the purification step. This can prevent impurities, such as particles, from accidentally forming asperities to cause a pattern defect on a cured film of the photocurable composition.

When a photocurable composition according to the present embodiment is used for the manufacture of semiconductor integrated circuits, it is desirable to avoid contamination of the photocurable composition with impurities containing metal atoms (metal impurities) so as not to affect the operation of the final product. To this end, the concentration of metal impurities in a photocurable composition according to the present embodiment is preferably 10 ppm or less, more preferably 100 ppb or less.

Method for Producing Patterned Film

A method for producing a patterned cured film according to the present embodiment will be described below. FIGS. 1A to 1D are schematic cross-sectional views illustrating a method for producing a patterned cured film according to the present embodiment.

A method for producing a patterned film according to the present embodiment includes

[1] a first step of placing a photocurable composition according to the present embodiment on a substrate,

[2] a second step of bringing the photocurable composition into contact with a mold,

[3] a third step of irradiating the photocurable composition with light, and

[4] a fourth step of separating the mold from the cured film formed in the third step.

A method for producing a patterned cured film according to the present embodiment is a method for producing a film by a photo-nanoimprint method.

A cured film formed by a method for producing a patterned cured film according to the present embodiment preferably has a pattern having a size of 1 nm or more and 10 mm or less, more preferably 10 nm or more and 100 μm or less. In general, a patterning technique for forming a film having a nanoscale (1 nm or more and 100 nm or less) pattern (textured structure) utilizing light is referred to as a photo-nanoimprint method. A method for producing a patterned cured film according to the present embodiment utilizes the photo-nanoimprint method.

Each of the steps will be described below.

<Placement Step [1]>

Figure 1A:
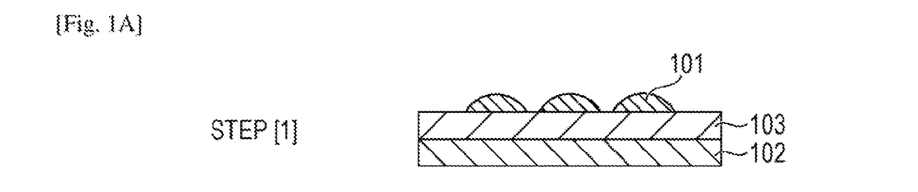
FIG. 1A is a schematic cross-sectional view illustrating a photo-nanoimprint technique according to an embodiment of the present invention.

In this step (placement step), as illustrated in FIG. 1A, a photocurable composition 101 according to the present embodiment is placed on (applied to) a substrate 102 to form a coating film.

The substrate 102 on which the photocurable composition 101 is to be placed is a workpiece substrate and is generally a silicon wafer. A layer to be processed 103 may be formed on the substrate 102. Another layer may be formed between the substrate 102 and the layer to be processed 103.

The substrate 102 is not limited to a silicon wafer. The substrate 102 may be selected from known substrates for semiconductor devices, such as aluminum, titanium-tungsten alloy, aluminum-silicon alloy, aluminum-copper-silicon alloy, silicon oxide, and silicon nitride substrates.

The layer to be processed 103 may be any layer that can be easily processed using a reverse layer described later as a mask and that can withstand processing of the underlying layer, such as the substrate 102. The layer to be processed 103 may have an uppermost surface layer formed of a carbon material, such as spin-on carbon, diamond-like carbon, or graphite.

The substrate 102 (workpiece substrate) or the layer to be processed 103 may be surface-treated by silane coupling treatment, silazane treatment, or formation of an organic thin film in order to improve adhesiveness to a photocurable composition.

In the present embodiment, the photocurable composition 101 can be placed on the substrate 102 or the layer to be processed 103 by an ink jet method, a dip coating method, an air knife coating method, a curtain coating method, a wire bar coating method, a gravure coating method, an extrusion coating method, a spin coating method, or a slit scanning method. In particular, an ink jet method may be used for the photo-nanoimprint method. The thickness of a layer to which a pattern is to be transferred (a coating film) depends on the application and may be 0.01 μm or more and 100.0 μm or less.

<Mold Contact Step [2]>

Figure 1B:
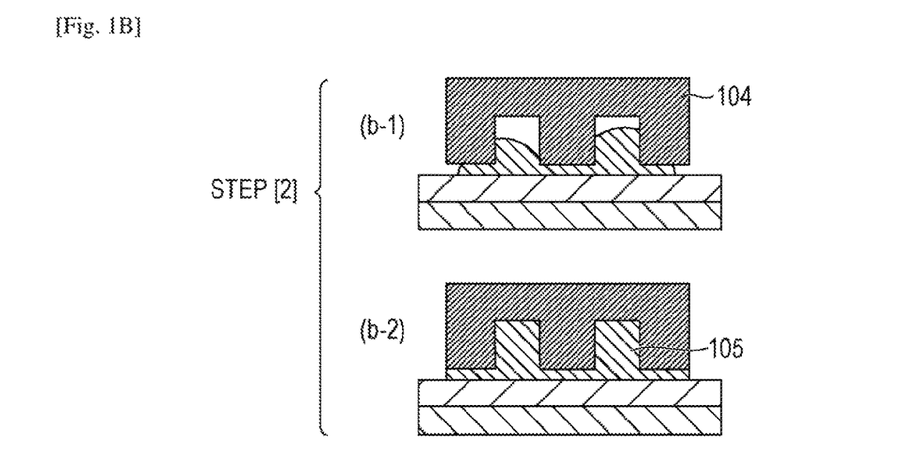
FIG. 1B is a schematic cross-sectional view illustrating the photo-nanoimprint technique.

As illustrated in FIG. 1B, the coating film of the photocurable composition 101 formed in the previous step (placement step) is then brought into contact with a mold 104 having an original pattern that is to be transferred to the coating film (FIG. 1B(b-1)). Thus, (part of) the coating film of the photocurable composition 101 fills recessed portions of a micro- and/or nano-pattern on a surface of the mold 104 and forms a coating film 105 in the micro- and/or nano-pattern on the mold 104 (FIG. 1B(b-2)).

Considering the next step (photoirradiation step), the mold 104 can be made of a light-transmitting material. More specifically, the mold 104 can be made of glass, quartz, a transparent resin, such as poly(methyl methacrylate) (PMMA) or polycarbonate, a transparent metal deposited film, a flexible film, such as a polydimethylsiloxane film, a photocured film, or a metal film. When the mold 104 is made of a transparent resin, the transparent resin should not be dissolved in the components of the photocurable composition 101. In particular, the mold 104 can be made of quartz, which has a low thermal expansion coefficient and low pattern distortion.

The micro- and/or nano-pattern on the surface of the mold 104 preferably has a pattern height 109 of 4 nm or more and 200 nm or less. In order to perform a patterning method according to the present invention, the pattern height 109 is preferably 10 nm or more and 40 nm or less, more preferably 10 nm or more and 30 nm or less.

A lower pattern height results in a lower demolding force, that is, a lower force with which the mold is removed from the photocured film of the resist in the demolding step, and also results in a smaller number of demolding defects, which is caused by part of the resist pattern being torn off by demolding and remaining on the mask. Adjacent resist patterns may come into contact with each other due to elastic deformation caused by the removal of the mold and may be adhered or broken. Such a defect is likely to be avoided when the ratio of the pattern height to the pattern width is approximately two or less (an aspect ratio of 2 or less). However, an excessively low pattern height results in low processing accuracy of the workpiece substrate. The mold 104 may be surface-treated before this mold contact step of the photocurable composition 101 and the mold 104 in order to improve the releasability of the mold 104 from the photocurable composition 101. In one surface treatment method, a release agent is applied to the mold 104 to form a release agent layer. The release agent to be applied to the mold 104 may be a silicone release agent, a fluorinated release agent, a hydrocarbon release agent, a polyethylene release agent, a polypropylene release agent, a paraffinic release agent, a montan release agent, or a carnauba release agent. For example, a commercially available coating type release agent, such as Optool (registered trademark) DSX manufactured by Daikin Industries, Ltd., may be used. These release agents may be used alone or in combination of two or more thereof. Among these, a fluorinated release agent and/or a hydrocarbon release agent may be used.

As illustrated in FIG. 1B(b-1), when the mold 104 is brought into contact with the photocurable composition 101 in the present step (mold contact step), any pressure may be applied to the photocurable composition 101. The pressure may be 0 MPa or more and 100 MPa or less, preferably 0 MPa or more and 50 MPa or less, more preferably 0 MPa or more and 30 MPa or less, still more preferably 0 MPa or more and 20 MPa or less.

In the present step, the mold 104 may be in contact with the photocurable composition 101 for any period of time. The time may be 0.1 seconds or more and 600 seconds or less, preferably 0.1 seconds or more and 300 seconds or less, more preferably 0.1 seconds or more and 180 seconds or less, still more preferably 0.1 seconds or more and 120 seconds or less.

The present step may be performed in the ambient atmosphere, under reduced pressure, or in an inert gas atmosphere. The effects of oxygen and moisture on the curing reaction can be suppressed under reduced pressure or in an inert gas atmosphere. When the present step is performed in an inert gas atmosphere, the inert gas may be nitrogen, carbon dioxide, helium, argon, a flon, an alternative of flon, or a mixture thereof. When the present step is performed in the ambient atmosphere or in a particular gas atmosphere, the pressure is preferably 0.0001 atm or more and 10 atm or less.

The mold contact step may be performed in an atmosphere containing a condensable gas (hereinafter referred to as a "condensable gas atmosphere"). The term "condensable gas", as used herein, refers to a gas that is condensed and liquefied under capillary pressure during filling when the recessed portions of the micro- and/or nano-pattern on the mold 104 and a gap between the mold 104 and the substrate 102 are filled with gases in the atmosphere together with (part of) the coating film 105. The condensable gas is in gaseous form in the atmosphere before the contact between the photocurable composition 101 (a layer to which a pattern is to be transferred) and the mold 104 in the mold contact step (FIG. 1B(b-1)).

In the mold contact step in a condensable gas atmosphere, the gas in the recessed portions of the micro- and/or nano-pattern is liquefied, and gas bubbles disappear, which improves the filling property. The condensable gas may dissolve in the photocurable composition 101.

The boiling point of the condensable gas may be below the ambient temperature of the mold contact step and preferably ranges from −10° C. to 23° C., more preferably 10° C. to 23° C. A boiling point in this range results in further improved filling property.

The vapor pressure of the condensable gas at the ambient temperature in the mold contact step may be below the mold pressure applied in the mold contact step and preferably ranges from 0.1 to 0.4 MPa. A vapor pressure in this range results in further improved filling property. A vapor pressure of more than 0.4 MPa at the ambient temperature tends to result in insufficient effects of disappeared gas bubbles. On the other hand, a vapor pressure of less than 0.1 MPa at the ambient temperature required pressure reduction, which tends to make the apparatus complex.

The ambient temperature in the mold contact step is not particularly limited and preferably ranges from 20° C. to 25° C.

The condensable gas may be a flon or an alternative thereof, for example, chlorofluorocarbon (CFC), such as trichlorofluoromethane, fluorocarbon (FC), hydrochlorofluorocarbon (HCFC), hydrofluorocarbon (HFC), such as 1,1,1,33-pentafluoropropane ($CHF_2CH_2CF_3$, HFC-245fa, PFP), or hydrofluoroether (HFE), such as pentafluoroethyl methyl ether ($CF_3CF_2OCH_3$, HFE-245mc).

Among these, 1,1,1,3,3-pentafluoropropane (vapor pressure at 23° C.: 0.14 MPa, boiling point: 15° C.), trichlorofluoromethane (vapor pressure at 23° C.: 0.1056 MPa, boiling point: 24° C.), and pentafluoroethyl methyl ether have good filling properties at an ambient temperature in the range of 20° C. to 25° C. in the mold contact step. In particular, 1,1,1,3,3-pentafluoropropane has improved safety.

These condensable gases may be used alone or in combination of two or more thereof. The condensable gas may be used in combination with a noncondensable gas, such as air, nitrogen, carbon dioxide, helium, and/or argon. The noncondensable gas to be mixed with the condensable gas may be helium in terms of filling property. Helium can pass through the mold 104. Thus, when the recessed portions of the micro- and/or nano-pattern on the mold 104 are filled with the gases in the atmosphere (the condensable gas and helium) together with (part of) the coating film 105 in the mold contact step, helium passes through the mold 104 while the condensable gas is liquefied.

<Photoirradiation Step [3]>

Figure 1C:
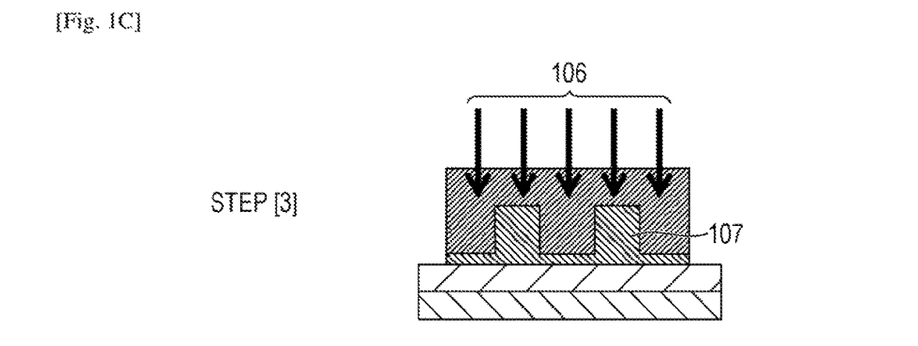
FIG. 1C is a schematic cross-sectional view illustrating the photo-nanoimprint technique.

As illustrated in FIG. 1C, a contact portion between the photocurable composition 101 and the mold 104 is irradiated with light through the mold 104. More specifically, the coating film 105 in the micro- and/or nano-pattern on the mold 104 is irradiated with light through the mold 104 (FIG. 1C). The coating film 105 in the micro- and/or nano-pattern on the mold 104 is cured by photoirradiation and forms a patterned cured film 107 (FIG. 1C).

The type of light applied to the photocurable composition 101 of the coating film 105 in the micro- and/or nano-pattern on the mold 104 depends on the sensitive wavelength of the photocurable composition 101. More specifically, the light may be selected from ultraviolet light having a wavelength of 150 nm or more and 400 nm or less, X-rays, and electron beams.

Among these, the light applied to the photocurable composition 101 (irradiation light 106) may be ultraviolet light. This is because many commercially available curing aids (photopolymerization initiators) are sensitive to ultraviolet light. Examples of ultraviolet light sources include, but are not limited to, high-pressure mercury lamps, ultra-high-pressure mercury lamps, low-pressure mercury lamps, deep-UV lamps, carbon arc lamps, chemical lamps, metal halide lamps, xenon lamps, KrF excimer lasers, ArF excimer lasers, and $F_2$ excimer lasers. In particular, an ultra-high-pressure mercury lamp may be used as an ultraviolet light source in the present embodiment. The number of light sources to be used may be one or two or more. The coating film 105 in the micro- and/or nano-pattern on the mold 104 may be entirely or partly irradiated with light.

The entire substrate 102 may be intermittently or continuously irradiated with light. A region A may be irradiated with light in a first irradiation process, and another region B may be irradiated with light in a second irradiation process.

<Demolding Step [4]>

Figure 1D:
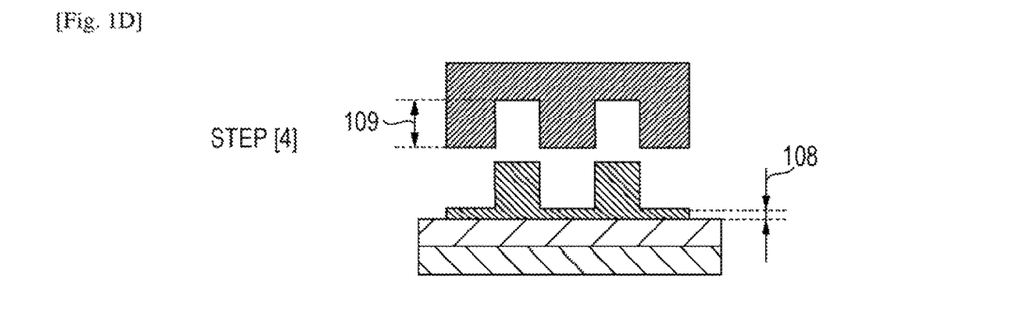
FIG. 1D is a schematic cross-sectional view illustrating the photo-nanoimprint technique.

The patterned cured film 107 is then separated from the mold 104. In the present step (demolding step), as illustrated in FIG. 1D, the patterned cured film 107 is separated from the mold 104. The freestanding patterned cured film 107 has a reverse pattern of the micro- and/or nano-pattern of the mold 104 formed in the step [3] (photoirradiation step). A portion of the cured film corresponding to the recessed portions of the uneven pattern of the patterned cured film 107 is hereinafter referred to as a residual film 108.

When the mold contact step is performed in a condensable gas atmosphere, the condensable gas is vaporized by the separation of the cured film 107 from the mold 104 in the demolding step, because the separation decreases the pressure at the interface between the cured film 107 and the mold 104. This tends to effectively decrease the demolding force required to separate the cured film 107 from the mold 104.

The patterned cured film 107 may be separated from the mold 104 by any method under any conditions, provided that the patterned cured film 107 is not physically damaged. For example, the patterned cured film 107 may be separated from the mold 104 by moving the mold 104 away from the substrate 102 (workpiece substrate) while the substrate 102 is fixed. Alternatively, the patterned cured film 107 may be separated from the mold 104 by moving the substrate 102 away from the mold 104 while the mold 104 is fixed. Alternatively, the patterned cured film 107 may be separated from the mold 104 by moving the substrate 102 and the mold 104 in opposite directions.

A cured product having a desired uneven pattern (a pattern resulting from the uneven surface profile of the mold 104) at a desired position can be produced through the series of steps [1] to [4] (production process).

In a method for producing a patterned film according to the present embodiment, a repeating unit (shot) composed of the steps [1] to [4] can be performed multiple times on a single workpiece substrate. The repeating unit (shot) composed of the steps [1] to [4] can be performed multiple times to form a cured film having a plurality of desired uneven patterns (patterns resulting from the uneven surface profile of the mold 104) at a desired position on the workpiece substrate.

In the present invention, a reverse process described in detail below is performed in order to process the substrate 102 (workpiece substrate) or the layer to be processed 103 utilizing the patterned cured film 107 produced through the steps [1] to [4].

<Reverse Layer Forming Step [5]>

Figure 2A:
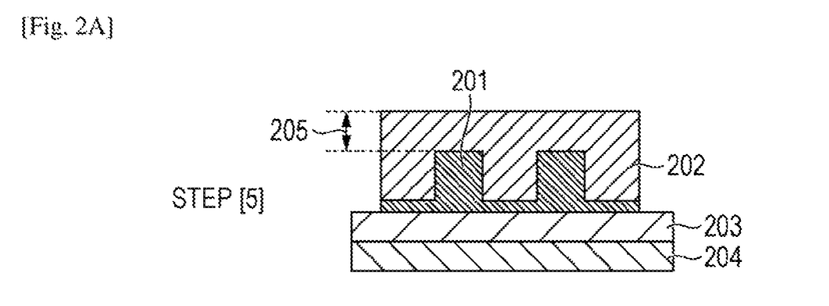
FIG. 2A is a schematic cross-sectional view illustrating a reverse process according to an embodiment of the present invention.

As illustrated in FIG. 2A, recessed portions of a resist pattern of a patterned cured film 201 formed in the step [4] are covered with a reverse layer 202.

The reverse layer 202 may be formed of a material selected from a silicon material, such as $SiO_2$ or SiN, an organic material containing silicon, a metal oxide film, such as $TiO_2$ or $Al_2O_3$, or a general metallic material.

For example, the reverse layer 202 may be formed from $SiO_2$ by spin coating of a spin-on-glass (SOG) material or by plasma CVD of tetraethyl orthosilicate (TEOS).

<Reverse Layer Partial Removal Step [6]>

Figure 2B:
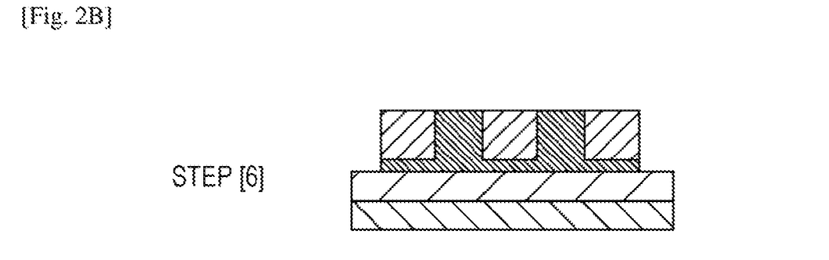
FIG. 2B is a schematic cross-sectional view illustrating the reverse process.

In the step [5], the reverse layer 202 is also formed on the raised portions of the patterned cured film 201 (such a portion of the reverse layer 202 is hereinafter referred to as an "excess reverse layer 205"). As illustrated in FIG. 2B, the excess reverse layer 205 must be removed to expose the raised portions of the patterned cured film 201.

The excess reverse layer 205 may be removed by any method, for example, by a known method, such as dry etching. A known dry etching apparatus may be used in dry etching. The source gas for dry etching depends on the elementary composition of the reverse layer 205 and may be a fluorocarbon gas, such as $CF_4$, $CHF_3$, $C_2F_6$, $C_3F_8$, $C_4F_8$, $C_5F_8$, $C_4F_6$, $CCl_2F_2$, or $CBrF_3$, or a halogen gas, such as $CCl_4$, $BCl_3$, $PCl_3$, $SF_6$, or $Cl_2$. These gases may be used as a mixture thereof.

<Etching Step [7]>

Figure 2C:
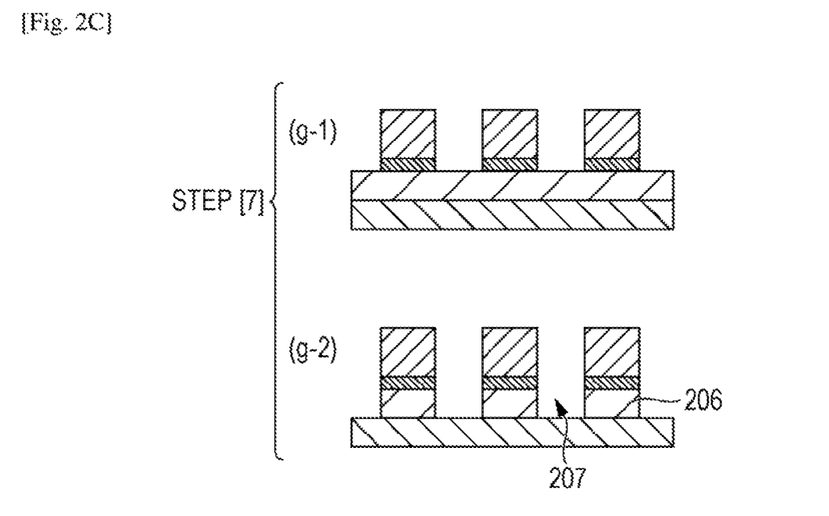
FIG. 2C is a schematic cross-sectional view illustrating the reverse process.

The exposed portion of the patterned cured film 201 in the previous step [6] is etched using the reverse layer 202 in the recessed portions of the resist pattern as a mask. As illustrated in FIG. 2C(g-1), an uneven pattern of the reverse layer 202 is formed. The etching method is not particularly limited and may be a known method, such as dry etching. A known dry etching apparatus may be used in dry etching. The source gas for dry etching depends on the elementary composition of the resist layer and may be an oxygen-containing gas, such as $O_2$, CO, or $CO_2$, an inert gas, such as He, $N_2$, or Ar, or $H_2$ or $NH_3$. These gases may be used as a mixture thereof.

In the present invention, as illustrated in FIG. 2C(g-2), a layer to be processed 203 can be etched using the uneven pattern of the reverse layer 202 as an etching mask and form a patterned layer to be processed 206. The etching conditions may be the same as or different from the etching conditions for the resist layer.

The patterned layer to be processed 206 formed through the steps [1] to [7] can also be used as an optical member (or part of an optical member), such as a diffraction grating or polarizer, to produce optical components. Such optical components can include a substrate 204 and the patterned layer to be processed 206 disposed on the substrate 204.

The patterned layer to be processed 206 formed by a patterning method according to the present embodiment can also be used as a film for interlayer insulating films in electronic components, such as semiconductor devices. The patterned layer to be processed 206 can also be used as a resist film in the production of semiconductor devices. Examples of the semiconductor devices include, but are not limited to, large-scale integrated circuits (LSIs), system LSIs, dynamic random access memories (DRAMs), synchronous dynamic random access memories (SDRAMs), Rambus dynamic random access memories (RDRAMs), and direct RDRAMs (D-RDRAMs).

When the patterned layer to be processed 206 is used as a processing mask for a substrate, an exposed surface of the substrate in the etching step [7] (a region 207 in FIG. 2C) may be subjected to etching or ion implantation. The patterned layer to be processed 206 functions as an etching mask. In addition, formation of an electronic component may form circuitry based on the pattern of the patterned layer to be processed 206 on the substrate 204. A circuit board for use in semiconductor devices can be manufactured through these steps. Such a circuit board can be coupled to a circuit control mechanism for the circuit board to form electronic equipment, such as displays, cameras, and medical devices.

EXAMPLES

Although the present invention will be further described in the following exemplary embodiments, the technical scope of the present invention is not limited to these exemplary embodiments.

Conditions for Reverse Process

Figure 3:
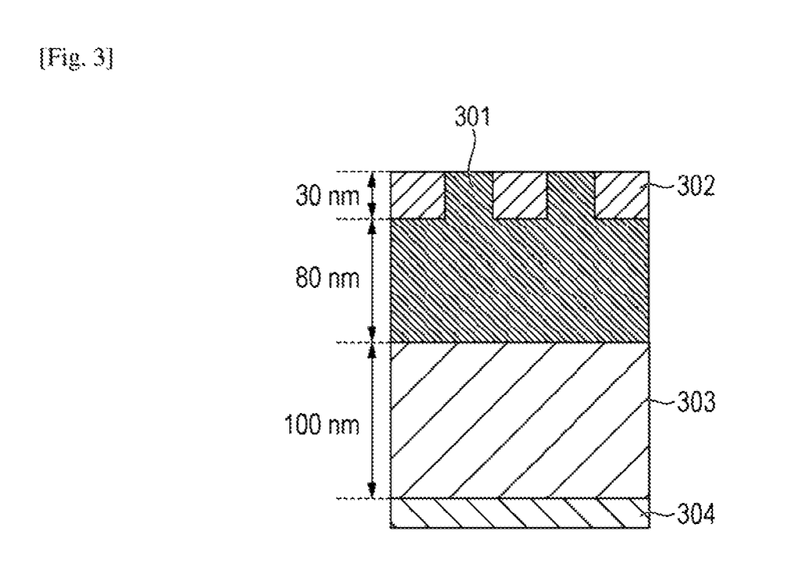
FIG. 3 is a schematic cross-sectional view illustrating exemplary embodiments and comparative examples.

The conditions for the reverse process will be described below with reference to FIG. 3.

Materials of Each Layer

Substrate 304: Si substrate

Layer to be processed 303: Diamond-like carbon (DLC)

Reverse layer 302: Spin-on-glass (SOG, T-111 manufactured by Honeywell)

The materials described in exemplary embodiments and comparative examples were used in photocurable compositions.

Preparation of Photocured Film of Photocurable Composition for Use in Measurement of Dry Etching Rate 2 μL of a photocurable composition was dropped on a silicon wafer on which an adhesion-promoting layer having a thickness of 60 nm was formed as an adhesion layer and was covered with a quartz glass sheet having a thickness of 1 mm, thereby filling a 25 mm×25 mm region with the photocurable composition.

The coating film was then irradiated for 200 seconds with light from a UV light source equipped with an ultra-high-pressure mercury lamp through an interference filter described below and through the quartz glass sheet. The interference filter used for the photoirradiation was VPF-25C-10-15-31300 (manufactured by Sigmakoki Co., Ltd.). The irradiation light was single-wavelength ultraviolet light having a wavelength of 313±5 nm. The illuminance was 1 mW/cm$^2$.

After the photoirradiation, the quartz glass sheet was removed. A photocured film of the photocurable composition having an average film thickness of 3.2 μm was formed on the silicon wafer.

Measurement of Dry Etching Rate in Each Layer

DLC and SOG were dry-etched for 500 seconds with a high-density plasma etching apparatus NE-550 manufactured by ULVAC. The etching gases and their flow rates were $O_2$/Ar=5 sccm/15 sccm. The dry etching rate (nm/s) was 1.9 nm/s for DLC and 0.21 nm/s for SOG, which were calculated from the decrease in film thickness due to dry etching.

With reference to NPL 1, the dry etching rate of the photocurable composition described later was calculated on the assumption that the dry etching rate is proportional to the OP value. More specifically, since an organic material having an OP of 2.43 had a dry etching rate of 4.0 nm/s under the dry etching conditions described above, the dry etching rate was calculated using the following equation: Dry etching rate=(OP value of (A) component of photocurable composition)/2.43×4.0 nm/s.

The dry etching rate (nm/s) may also be determined by dry etching a photocured film of a photocurable composition prepared as described above and measuring the decrease in film thickness due to the dry etching.

Thickness of Each Layer

The pattern height or the thickness of the reverse layer 302 was 30 nm. The residual film had a thickness of 80 nm. The layer to be processed 303 had a thickness of 100 nm.

Exemplary Embodiment 1

(1) Preparation of Photocurable Composition (a-1)

A blend of the following components (A) and (B) was passed through a 0.2 μm ultra-high molecular weight polyethylene filter to prepare a photocurable composition (a-1) according to Exemplary Embodiment 1. The (A) component had a mole fraction weighted average molecular weight of 212.24.

(1-1) Component (A): 100 parts by weight in total

<A-1> Neopentyl glycol diacrylate (manufactured by Kyoeisha Chemical Co., Ltd., trade name: NP-A, molecular weight: 212.24): 100 parts by weight (1-2) Component (B): 3 parts by weight in total <B-1> Lucirin (registered trademark) TPO (manufactured by BASF): 3 parts by weight (2) Measurement of Viscosity of Photocurable Composition (a-1)

The photocurable composition (a-1) had a viscosity of 5.33 mPa s at 25° C. as measured with a cone-and-plate viscometer RE-85L (manufactured by Toki Sangyo Co., Ltd.).

(3) Formation of Photocured Film

A photocured film was formed using the procedure described above.

The photocured film was used to estimate the dry etching rate and the etching thickness of the reverse layer in the reverse process illustrated in FIG. 3 as described below.

(4) Dry Etching Rate of Cured Film of Photocurable Composition (a-1)

The (A) component of the photocurable composition (a-1) had an OP of 4.43. Because an organic material having an OP of 2.43 had a dry etching rate of 4.0 nm/s under the dry etching conditions, the photocurable composition (a-1) having an OP of 4.43 is assumed to have a dry etching rate of 7.29 nm/s.

(5) Etching Thickness of Reverse Layer

The etching time of the photocurable composition layer having a thickness of 80 nm and the layer to be processed having a thickness of 100 nm under the conditions described above is estimated to be 67.7 seconds. The etching thickness of the reverse layer for this etching time is estimated to be 14.2 nm.

Exemplary Embodiment 2

(1) Preparation of Photocurable Composition (a-2)

A blend of the following components (A) and (B) was passed through a 0.2 µm ultra-high molecular weight polyethylene filter to prepare a photocurable composition (a-2) according to Exemplary Embodiment 2. The (A) component had a mole fraction weighted average molecular weight of 210.25.

(1-1) Component (A): 100 parts by weight in total
<A-1> Neopentyl glycol diacrylate (manufactured by Kyoeisha Chemical Co., Ltd., trade name: NP-A, molecular weight: 212.24): 50 parts by weight
<A-2> Isobornyl acrylate (manufactured by Kyoeisha Chemical Co., Ltd., trade name: IB-XA, molecular weight: 208.3): 50 parts by weight
(1-2) Component (B): 3 parts by weight in total
<B-1> Lucirin (registered trademark) TPO (manufactured by BASF): 3 parts by weight (2) Measurement of Viscosity of Photocurable Composition (a-2)

The photocurable composition (a-2) had a viscosity of 6.34 mPa s as measured in the same manner as in Exemplary Embodiment 1.

(3) Formation of Photocured Film

A photocured film was formed using the procedure described above.

The photocured film was used to estimate the dry etching rate and the etching thickness of the reverse layer in the reverse process illustrated in FIG. 3 as described below.

(4) Dry Etching Rate of Cured Film of Photocurable Composition (a-2)

The (A) component of the photocurable composition (a-2) had an OP of 3.80. The dry etching rate of the photocurable composition (a-2) is assumed to be 6.26 nm/s by the calculation method described in Exemplary Embodiment 1.

(5) Etching Thickness of Reverse Layer

The etching time of the photocurable composition layer having a thickness of 80 nm and the layer to be processed having a thickness of 100 nm under the conditions described above is estimated to be 70.2 seconds. The etching thickness of the reverse layer for this etching time is estimated to be 14.7 nm.

Exemplary Embodiment 3

(1) Preparation of Photocurable Composition (a-3)

A blend of the following components (A) and (B) was passed through a 0.2 µm ultra-high molecular weight polyethylene filter to prepare a photocurable composition (a-3) according to Exemplary Embodiment 3. The (A) component had a mole fraction weighted average molecular weight of 226.27.

(1-1) Component (A): 100 parts by weight in total
<A-3>1,6-hexanediol diacrylate (manufactured by Osaka Organic Chemical Industry Ltd., trade name: Viscoat #230, molecular weight: 226.27): 100 parts by weight
(1-2) Component (B): 3 parts by weight in total
<B-1> Lucirin (registered trademark) TPO (manufactured by BASF): 3 parts by weight (2) Measurement of Viscosity of Photocurable Composition (a-3)

The photocurable composition (a-3) had a viscosity of 5.91 mPa s as measured in the same manner as in Exemplary Embodiment 1.

(3) Formation of Photocured Film

A photocured film was formed using the procedure described above.

The photocured film was used to estimate the dry etching rate and the etching thickness of the reverse layer in the reverse process illustrated in FIG. 3 as described below.

(4) Dry Etching Rate of Cured Film of Photocurable Composition (a-3)

The (A) component of the photocurable composition (a-3) had an OP of 4.25. The dry etching rate of the photocurable composition (a-3) is assumed to be 7.00 nm/s by the calculation method described in Exemplary Embodiment 1.

(5) Etching Thickness of Reverse Layer

The etching time of the photocurable composition layer having a thickness of 80 nm and the layer to be processed having a thickness of 100 nm under the conditions described above is estimated to be 68.4 seconds. The etching thickness of the reverse layer for this etching time is estimated to be 14.4 nm.

Exemplary Embodiment 4

(1) Preparation of Photocurable Composition (a-4)

A blend of the following components (A) and (B) was passed through a 0.2 µm ultra-high molecular weight polyethylene filter to prepare a photocurable composition (a-4) according to Exemplary Embodiment 4. The (A) component had a mole fraction weighted average molecular weight of 282.38.

(1-1) Component (A): 100 parts by weight in total
<A-4>1,10-decanediol diacrylate (manufactured by Shin Nakamura Chemical Co., Ltd., trade name: A-DOD-N, molecular weight: 282.38): 100 parts by weight
(1-2) Component (B): 3 parts by weight in total
<B-1> Lucirin (registered trademark) TPO (manufactured by BASF): 3 parts by weight (2) Measurement of Viscosity of Photocurable Composition (a-4)

The photocurable composition (a-4) had a viscosity of 9.22 mPa s as measured in the same manner as in Exemplary Embodiment 1.

(3) Formation of Photocured Film

A photocured film was formed using the procedure described above.

The photocured film was used to estimate the dry etching rate and the etching thickness of the reverse layer in the reverse process illustrated in FIG. 3 as described below.

(4) Dry Etching Rate of Cured Film of Photocurable Composition (a-4)

The (A) component of the photocurable composition (a-4) had an OP of 3.83. The dry etching rate of the photocurable composition (a-4) is assumed to be 6.30 nm/s by the calculation method described in Exemplary Embodiment 1.

(5) Etching Thickness of Reverse Layer

The etching time of the photocurable composition layer having a thickness of 80 nm and the layer to be processed having a thickness of 100 nm under the conditions described above is estimated to be 70.1 seconds. The etching thickness of the reverse layer for this etching time is estimated to be 14.7 nm.

Exemplary Embodiment 5

(1) Preparation of Photocurable Composition (a-5)

A blend of the following components (A) and (B) was passed through a 0.2 µm ultra-high molecular weight polyethylene filter to prepare a photocurable composition (a-5)

according to Exemplary Embodiment 5. The (A) component had a mole fraction weighted average molecular weight of 296.32.

(1-1) Component (A): 100 parts by weight in total

<A-5> Trimethylolpropane triacrylate (manufactured by Sigma-Aldrich Corporation, molecular weight: 296.32): 100 parts by weight (1-2) Component (B): 3 parts by weight in total <B-1> Lucirin (registered trademark) TPO (manufactured by BASF): 3 parts by weight (2) Measurement of Viscosity of Photocurable Composition (a-5)

The photocurable composition (a-5) had a viscosity of 84.7 mPa s as measured in the same manner as in Exemplary Embodiment 1.

(3) Formation of Photocured Film

A photocured film was formed using the procedure described above.

The photocured film was used to estimate the dry etching rate and the etching thickness of the reverse layer in the reverse process illustrated in FIG. 3 as described below.

(4) Dry Etching Rate of Cured Film of Photocurable Composition (a-5)

The (A) component of the photocurable composition (a-5) had an OP of 4.56. The dry etching rate of the photocurable composition (a-5) is assumed to be 7.51 nm/s by the calculation method described in Exemplary Embodiment 1.

(5) Etching Thickness of Reverse Layer

The etching time of the photocurable composition layer having a thickness of 80 nm and the layer to be processed having a thickness of 100 nm under the conditions described above is estimated to be 67.3 seconds. The etching thickness of the reverse layer for this etching time is estimated to be 14.1 nm.

Comparative Example 1

(1) Preparation of Photocurable Composition (b-1)

A blend of the following components (A) and (B) was passed through a 0.2 μm ultra-high molecular weight polyethylene filter to prepare a photocurable composition (b-1) according to Comparative Example 1. The (A) component had a mole fraction weighted average molecular weight of 211.24.

(1-1) Component (A): 100 parts by weight in total

<A-1> Neopentyl glycol diacrylate (manufactured by Kyoeisha Chemical Co., Ltd., trade name: NP-A, molecular weight: 212.24): 25 parts by weight <A-2> Isobornyl acrylate (manufactured by Kyoeisha Chemical Co., Ltd., trade name: IB-XA, molecular weight: 208.3): 75 parts by weight (1-2) Component (B): 3 parts by weight in total <B-1> Lucirin (registered trademark) TPO (manufactured by BASF): 3 parts by weight (2) Measurement of Viscosity of Photocurable Composition (b-1)

The photocurable composition (b-1) had a viscosity of 6.91 mPa s as measured in the same manner as in Exemplary Embodiment 1.

(3) Formation of Photocured Film

A photocured film was formed using the procedure described above.

The photocured film was used to estimate the dry etching rate and the etching thickness of the reverse layer in the reverse process illustrated in FIG. 3 as described below.

(4) Dry Etching Rate of Cured Film of Photocurable Composition (b-1)

The (A) component of the photocurable composition (b-1) had an OP of 3.49. The dry etching rate of the photocurable composition (b-1) is assumed to be 5.74 nm/s by the calculation method described in Exemplary Embodiment 1.

(5) Etching Thickness of Reverse Layer

The etching time of the photocurable composition layer having a thickness of 80 nm and the layer to be processed having a thickness of 100 nm under the conditions described above is estimated to be 71.8 seconds. The etching thickness of the reverse layer for this etching time is estimated to be 15.1 nm.

Comparative Example 2

(1) Preparation of Photocurable Composition (b-2)

A blend of the following components (A) and (B) was passed through a 0.2 μm ultra-high molecular weight polyethylene filter to prepare a photocurable composition (b-2) according to Comparative Example 2. The (A) component had a mole fraction weighted average molecular weight of 222.92.

(1-1) Component (A): 100 parts by weight in total

<A-2> isobornyl acrylate (manufactured by Kyoeisha Chemical Co., Ltd., trade name: IB-XA, molecular weight: 208.3): 75 parts by weight <A-4>1,10-decanediol diacrylate (manufactured by Shin Nakamura Chemical Co., Ltd., trade name: A-DOD-N, molecular weight: 282.38): 25 parts by weight (1-2) Component (B): 3 parts by weight in total <B-1> Lucirin (registered trademark) TPO (manufactured by BASP): 3 parts by weight (2) Measurement of Viscosity of Photocurable Composition (b-2)

The photocurable composition (b-2) had a viscosity of 7.83 mPa s as measured in the same manner as in Exemplary Embodiment 1.

(3) Formation of Photocured Film

A photocured film was formed using the procedure described above.

The photocured film was used to estimate the dry etching rate and the etching thickness of the reverse layer in the reverse process illustrated in FIG. 3 as described below.

(4) Dry Etching Rate of Cured Film of Photocurable Composition (b-2)

The (A) component of the photocurable composition (b-2) had an OP of 3.31. The dry etching rate of the photocurable composition (b-2) is assumed to be 5.45 nm/s by the calculation method described in Exemplary Embodiment 1.

(5) Etching Thickness of Reverse Layer

The etching time of the photocurable composition layer having a thickness of 80 nm and the layer to be processed having a thickness of 100 nm under the conditions described above is estimated to be 72.8 seconds. The etching thickness of the reverse layer for this etching time is estimated to be 15.3 nm.

Comparative Example 3

(1) Preparation of Photocurable Composition (b-3)

A blend of the following components (A) and (B) was passed through a 0.2 μm ultra-high molecular weight polyethylene filter to prepare a photocurable composition (b-3) according to Comparative Example 3. The (A) component had a mole fraction weighted average molecular weight of 206.04.

(1-1) Component (A): 100 parts by weight in total
<A-4> 1,10-decanediol diacrylate (manufactured by Shin Nakamura Chemical Co., Ltd., trade name: A-DOD-N, molecular weight: 282.38): 50 parts by weight
<A-6> Benzyl acrylate (manufactured by Osaka Organic Chemical Industry Ltd., trade name: V#160, molecular weight: 162.19): 50 parts by weight
(1-2) Component (B): 3 parts by weight in total
<B-1> Lucirin (registered trademark) TPO (manufactured by BASF): 3 parts by weight
(2) Measurement of Viscosity of Photocurable Composition (b-3)
The photocurable composition (b-3) had a viscosity of 3.84 mPa s as measured in the same manner as in Exemplary Embodiment 1.
(3) Formation of Photocured Film
A photocured film was formed using the procedure described above.
The photocured film was used to estimate the dry etching rate and the etching thickness of the reverse layer in the reverse process illustrated in FIG. 3 as described below.
(4) Dry Etching Rate of Cured Film of Photocurable Composition (b-3)
The (A) component of the photocurable composition (b-3) had an OP of 3.15. The dry etching rate of the photocurable composition (b-3) is assumed to be 5.19 nm/s by the calculation method described in Exemplary Embodiment 1.
(5) Etching Thickness of Reverse Layer
The etching time of the photocurable composition layer having a thickness of 80 nm and the layer to be processed having a thickness of 100 nm under the conditions described above is estimated to be 73.8 seconds. The etching thickness of the reverse layer for this etching time is estimated to be 15.5 nm.

Comparative Example 4

(1) Preparation of Photocurable Composition (b-4)
A blend of the following components (A) and (B) was passed through a 0.2 μm ultra-high molecular weight polyethylene filter to prepare a photocurable composition (b-4) according to Comparative Example 4. The (A) component had a mole fraction weighted average molecular weight of 161.79.
(1-1) Component (A): 100 parts by weight in total
<A-7> Ethylene glycol diacrylate (manufactured by Sigma-Aldrich Corporation, molecular weight: 170.16): 48 parts by weight
<A-7> Cyclohexyl acrylate (manufactured by Osaka Organic Chemical Industry Ltd., trade name: V#155, molecular weight: 154.21): 48 parts by weight
(1-2) Component (B): 3 parts by weight in total
<B-1> Lucirin (registered trademark) TPO (manufactured by BASF): 3 parts by weight
(2) Measurement of Viscosity of Photocurable Composition (b-4)
The photocurable composition (b-4) had a viscosity of 2.73 mPa s as measured in the same manner as in Exemplary Embodiment 1.
(3) Formation of Photocured Film
A photocured film was formed using the procedure described above.
The photocured film was used to estimate the dry etching rate and the etching thickness of the reverse layer in the reverse process illustrated in FIG. 3 as described below.
(4) Dry Etching Rate of Cured Film of Photocurable Composition (b-4)
The (A) component of the photocurable composition (b-4) had an OP of 4.49. The dry etching rate of the photocurable composition (b-4) is assumed to be 7.39 nm/s by the calculation method described in Exemplary Embodiment 1.
(5) Etching Thickness of Reverse Layer
The etching time of the photocurable composition layer having a thickness of 80 nm and the layer to be processed having a thickness of 100 nm under the conditions described above is estimated to be 67.5 seconds. The etching thickness of the reverse layer for this etching time is estimated to be 14.2 nm.

Evaluation of Applicability of Cured Films according to Exemplary Embodiments and Comparative Examples in Reverse Process Table 1 summarizes the results for Exemplary Embodiments 1 to 5 and Comparative Examples 1 to 3.

TABLE 1

|  | Composition Name | Mole fraction weighted average molecular weight | OP | Viscosity (mPa s) | Etching thickness of reverse layer (nm) | Evaluation of etching performance | Evaluation of volatility |
| --- | --- | --- | --- | --- | --- | --- | --- |
| Exemplary embodiment 1 | (a-1) | 212.24 | 4.43 | 5.33 | 14.2 | ○ | ○ |
| Exemplary embodiment 2 | (a-2) | 210.25 | 3.80 | 6.34 | 14.7 | ○ | ○ |
| Exemplary embodiment 3 | (a-3) | 226.27 | 4.25 | 5.91 | 14.4 | ○ | ○ |
| Exemplary embodiment 4 | (a-4) | 282.38 | 3.83 | 9.22 | 14.7 | ○ | ○ |
| Exemplary embodiment 5 | (a-5) | 296.32 | 4.56 | 84.7 | 14.1 | ○ | ○ |
| Comparative example 1 | (b-1) | 211.24 | 3.49 | 6.91 | 15.1 | X | ○ |
| Comparative example 2 | (b-2) | 282.38 | 3.31 | 7.83 | 15.3 | X | ○ |
| Comparative example 3 | (b-3) | 206.04 | 3.15 | 3.84 | 15.5 | X | ○ |
| Comparative example 4 | (b-4) | 161.79 | 4.49 | 2.73 | 14.2 | ○ | X |

In Table 1, the etching performance was good (circle) if the etching thickness of the reverse layer after the etching was completed was estimated to be 15 nm or less and was rated as poor (cross) if the etching thickness was more than 15 nm.

In the evaluation of volatility, a composition having a mole fraction weighted average molecular weight of 200 or more was rated as good (circle), and a composition having a mole fraction weighted average molecular weight of less than 200 was rated as poor (cross). At a fraction weighted average molecular weight of 200 or more, substantially no volatilization occurs, and the photocurable composition suffers no performance degradation.

Table 1 shows that in the reverse process using the cured films according to Exemplary Embodiments 1 to 5, the etching thickness of the reverse layer was less than half (15 nm) of the thickness of the reverse layer (30 nm). In contrast, in the cured films according to Comparative Examples 1 to 3, the etching thickness of the reverse layer was more than 15 nm.

In general, it is desirable that the thickness of the etching mask be more than half of its initial thickness after etching is completed. Thus, the photocurable compositions according to Exemplary Embodiments 1 to 5 have sufficient processing accuracy, and the photocurable compositions according to Comparative Examples 1 to 3 have insufficient processing accuracy.

In Exemplary Embodiments 1 to 5 and Comparative Examples 1 to 3, the mole fraction weighted average molecular weight was more than 200, and the photocurable compositions on the workpiece substrate volatilize negligibly.

In contrast, in Comparative Example 4, the mole fraction weighted average molecular weight was less than 200, and low-molecular-weight compounds having a molecular weight of 200 or less volatilize. Thus, the photocured film may have a thickness smaller than the desired thickness.

These results demonstrate that a method according to the present embodiment can achieve sufficient processing accuracy even in a photo-nanoimprint technique using a mold having an uneven pattern height of 30 nm or less.

Thus, the present invention can provide a patterning method that allows processing with a mold having a low pattern height.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-039402, filed Feb. 27, 2015, which is hereby incorporated by reference herein in its entirety.

The invention claimed is:

1. A patterning method comprising:
   placing a photocurable composition on a substrate;
   bringing the photocurable composition into contact with a mold having an uneven pattern;
   irradiating the photocurable composition with light to form a cured film;
   separating the cured film from the mold;
   forming a reverse layer on the cured film to which the uneven pattern of the mold has been transferred;
   while recessed portions of the uneven pattern of the cured film are filled with the reverse layer, removing a part of the reverse layer to expose raised portions of the uneven pattern; and
   etching the photocurable composition layer to form a reverse pattern using the reverse layer in the recessed portions as a mask,
   wherein the photocurable composition contains at least a polymerizable compound (A) component and a photopolymerization initiator (B) component, the (A) component has a mole fraction weighted average molecular weight of 200 or more and 1000 or less, the (A) component has an Ohnishi parameter (OP) of 3.80 or more, and the Ohnishi parameter (OP) of the (A) component is a mole fraction weighted average of $N/(N_C - N_O)$, N denotes a total number of atoms in a molecule, $N_C$ denotes a number of carbon atoms in the molecule, and $N_O$ denotes a number of oxygen atoms in the molecule.

2. The patterning method according to claim 1, wherein the mold has an uneven pattern having a height of 10 nm or more and 40 nm or less.

3. The patterning method according to claim 1, wherein the mold has an uneven pattern having a height of 10 nm or more and 30 nm or less.

4. The patterning method according to claim 1, wherein the (A) component of the photocurable composition has an Ohnishi parameter (OP) of 4.50 or more.

5. The patterning method according to claim 1, wherein the photocurable composition has a viscosity of 1 mPa s or more and 12 mPa s or less.

6. The patterning method according to claim 1, wherein the photocurable composition further contains a solvent (D).

7. The patterning method according to claim 1, wherein the reverse layer is formed of a spin-on-glass material.

8. The patterning method according to claim 1, wherein the substrate includes an uppermost surface layer formed of a carbon material.

9. The patterning method according to claim 1, wherein the mold has a quartz surface.

10. The patterning method according to claim 1, further comprising:
    forming an organic thin film in order to improve adhesiveness between the substrate and the photocurable composition.

11. A method for producing a processed substrate, comprising the patterning method according to claim 1.

12. A method for producing an optical component, comprising the patterning method according to claim 1.

13. A method for producing a circuit board, comprising the patterning method according to claim 1.

14. A method for producing an electronic component, comprising:
    forming a circuit board by the method for producing a circuit board according to claim 12; and
    forming an electronic component on the circuit board.

15. The patterning method according to claim 1, wherein bringing the photocurable composition into contact with the mold is performed in an atmosphere containing a condensable gas.

16. The patterning method according to claim 15, wherein the condensable gas is 1,1,1,3,3-pentafluoropropane.

17. The patterning method according to claim 15, wherein bringing the photocurable composition into contact with the mold is performed in an atmosphere containing a gas mixture of the condensable gas and a noncondensable gas.

18. The patterning method according to claim 17, wherein the noncondensable gas is helium.

* * * * *